United States Patent
Fried et al.

(10) Patent No.: US 10,823,825 B2
(45) Date of Patent: Nov. 3, 2020

(54) SYSTEM AND METHOD FOR WIDE-AREA SURVEILLANCE

(71) Applicant: 3DEO, INC., Dover, MA (US)

(72) Inventors: Dale G. Fried, Dover, MA (US);
Brandon R. Call, Orem, UT (US)

(73) Assignee: 3DEO, INC, Dover, MA (US)

( * ) Notice: Subject to any disclaimer, the term of this patent is extended or adjusted under 35 U.S.C. 154(b) by 561 days.

(21) Appl. No.: 15/582,791

(22) Filed: May 1, 2017

(65) Prior Publication Data
US 2018/0275252 A1    Sep. 27, 2018

Related U.S. Application Data

(60) Provisional application No. 62/330,289, filed on May 2, 2016.

(51) Int. Cl.
*G01S 7/481*      (2006.01)
*G01S 17/89*      (2020.01)
(Continued)

(52) U.S. Cl.
CPC .......... *G01S 7/4817* (2013.01); *G01S 7/4816* (2013.01); *G01S 7/4863* (2013.01); *G01S 17/04* (2020.01); *G01S 17/42* (2013.01); *G01S 17/66* (2013.01); *G01S 17/89* (2013.01); *G01S 17/93* (2013.01); *G06T 15/04* (2013.01); *G06T 2210/56* (2013.01); *H01L 27/14643* (2013.01); *H01L 31/107* (2013.01)

(58) Field of Classification Search
CPC .... G01S 7/4817; G01S 7/4816; G01S 7/4863; G01S 17/026; G01S 17/42; G01S 17/66; G01S 17/89; G01S 17/93
See application file for complete search history.

(56) References Cited

U.S. PATENT DOCUMENTS 5,268,565 A * 12/1993 Katoh ................. G02B 5/09
                                                              235/462.31
6,448,572 B1    9/2002 Tennant et al.
(Continued)

FOREIGN PATENT DOCUMENTS

WO    WO2016033036 A2    3/2016

*Primary Examiner* — Eric L Bolda
(74) *Attorney, Agent, or Firm* — AKC Patents, LLC; Aliki K. Collins

(57) ABSTRACT

A system for generating a 3D image of a scene includes a transmitter, a receiver, a scanning system and a data processing computer. The transmitter includes a pulsed laser generating optical pulses for illuminating the scene, and the optical pulses have a pulse width of less than 20 nanoseconds and a pulse repetition frequency in the range of 20 kHz to 200 kHz. The receiver includes a sensor to detect light scattered and reflected from the scene, and the sensor comprises one or more arrays of Geiger-mode avalanche photodiodes. The scanning system allows the transmitter and receiver subsystem field-of-view (FOV) to interrogate a field-of-regard (FOR) of at least 30 degrees, with update rates faster than once per 5 seconds, resolution higher than 1 million resolution elements per second, and FOR aspect ratios of 1:10 to 1:1. The data processing computer continuously generates 3D point clouds with latency less than 5 seconds, and generates alarms indicating anomalous activity within the scene.

18 Claims, 13 Drawing Sheets

(51) Int. Cl.
    *G01S 17/42*    (2006.01)
    *G01S 17/93*    (2020.01)
    *G01S 17/04*    (2020.01)
    *G01S 7/4863*   (2020.01)
    *G01S 17/66*    (2006.01)
    *G06T 15/04*    (2011.01)
    *H01L 27/146*   (2006.01)
    *H01L 31/107*   (2006.01)

(56) References Cited

U.S. PATENT DOCUMENTS

| | | | |
|---|---|---|---|
| 8,159,680 B2 | 4/2012 | Robinson et al. | |
| 9,069,061 B1 | 6/2015 | Harwit | |
| 9,239,959 B1* | 1/2016 | Evans | G01S 17/931 |
| 9,804,264 B2* | 10/2017 | Villeneuve | H01S 3/06754 |
| 2005/0189503 A1* | 9/2005 | Jamieson | G01N 21/251 |
| | | | 250/559.4 |
| 2006/0192086 A1* | 8/2006 | Niclass | H01L 27/14647 |
| | | | 250/214.1 |
| 2012/0170029 A1* | 7/2012 | Azzazy | H01J 31/26 |
| | | | 356/139.04 |
| 2014/0293263 A1* | 10/2014 | Justice | G01S 17/42 |
| | | | 356/4.01 |
| 2015/0026023 A1* | 1/2015 | Sirota | G06Q 50/02 |
| | | | 705/35 |
| 2015/0177383 A1 | 6/2015 | Ruff et al. | |
| 2015/0378023 A1 | 12/2015 | Royo Royo et al. | |

* cited by examiner

Focusing optic options:
a) Single optic placed before first beam splitter
b) Individual optic before each array
c) Optic between first beam splitter and second beam splitter, plus another optic between first beam splitter and array #1

SYSTEM AND METHOD FOR WIDE-AREA SURVEILLANCE

CROSS REFERENCE TO RELATED CO-PENDING APPLICATIONS

This application claims the benefit of U.S. provisional application Ser. No. 62/330,289 filed on May 2, 2016 and entitled SYSTEM AND METHOD FOR WIDE-AREA SURVEILLANCE, which is commonly assigned and the contents of which are expressly incorporated herein by reference.

FIELD OF THE INVENTION

The present invention relates to a system and method for wide-area surveillance and in particular to a system and method for wide-area surveillance that utilizes a single-photon 3D Ladar.

BACKGROUND OF THE INVENTION

A substantial problem in surveillance of large areas is detecting anomalous activity in the midst of an abundance of normal activity. Optical sensors are often used because of their exquisite angular resolution, but the lack of depth information hampers algorithms tasked with differentiating anomalous activity from normal activity.

SUMMARY OF THE INVENTION

The present invention solves the problem of high false alarm rate and low detection probability in wide-area surveillance, especially of airspaces, by using a rapid-update 3D ladar to monitor the scene geometry. It includes the general approach of using 3D ladar for anomaly detection based on short-time 3D geometric change detection, as well as specific implementations of the hardware and software needed to achieve these purposes.

In general, in one aspect, the invention features system for generating a 3D image of a scene including a transmitter, a receiver, a scanning system and a data processing computer. The transmitter includes a pulsed laser generating optical pulses for illuminating the scene, and the optical pulses have a pulse width of less than 20 nanoseconds and a pulse repetition frequency in the range of 20 kHz to 200 kHz. The receiver includes a sensor to detect light scattered and reflected from the scene, and the sensor comprises one or more arrays of Geiger-mode avalanche photodiodes. The scanning system allows the transmitter and receiver subsystem field-of-view (FOV) to interrogate a field-of-regard (FOR) of at least 30 degrees, with update rates faster than once per 5 seconds, resolution higher than 1 million resolution elements per second, and FOR aspect ratios of 1:10 to 1:1. The data processing computer continuously generates 3D point clouds with latency less than 5 seconds, and generates alarms indicating anomalous activity within the scene.

Implementations of this aspect of the invention may include one or more of the following features. The scanning system includes a polygonal mirror scanner that rotates and scans the FOV across the scene and the polygonal mirror scanner has a number of facets in the range of 3 to 12 and the angles between each of the facets and a rotational axis of the polygonal mirror scanner are not all the same. The system further includes a secondary angular shifting element arranged between the receiver and the polygonal mirror scanner and wherein the secondary shifting element tilts the FOV. The secondary angular shifting element is synchronously modulated with the polygonal scanner's rotation. The system receiver has a plurality of additional sensors and each additional sensor comprises one or more arrays of Geiger-mode avalanche photodiodes and each additional sensor receives light reflected from different facets of the polygonal mirror scanner. The receiver includes a plurality of additional sensors and each additional sensor comprises one or more arrays of Geiger-mode avalanche photodiodes and each additional sensor is operated so as to be sensitive to light originating from scene elements located at different ranges. The system further includes one or more unequal beam splitters arranged in an optical path between the scanned FOV and the sensors and the beam splitters split the light from the scanned FOV so that each of the additional sensors is illuminated by a different fraction of the received light. The data processing computer is coupled to the receiver to receive data from the receiver and the data processing computer comprises at least two or more of a point cloud formation algorithm, a surface estimation algorithm, a 3D change detection algorithm, a 3D track creation algorithm, and a false alarm reduction algorithm. The data processing computer processes the received data via the 3D change detection algorithm to detect geometric changes over time and track objects moving in the scene. The data processing computer further processes the received data via the surface estimation algorithm to reduce crosstalk effects between the Geiger-mode avalanche photodiodes by taking into account a probability that each raw photon detection is a product of crosstalk from neighboring pixel firing events. The data processing computer processes the received data via the false alarm reduction algorithm to reduce false alarms. The false alarm reduction algorithm reduces false alarms by classifying a potential target based on observed behavior. The false alarm reduction algorithm reduces false alarms by classifying a potential target based on return signal strength and time variations of the signal strength. The false alarm reduction algorithm reduces false alarms by utilizing third party information comprising building locations, digital terrain elevation data, or foliage location and type. The 3D track creation algorithm provides detection or track information over a line of communication to a central operator station. The system further includes position sensors. The system further includes orientation sensors and the orientation sensors comprise inertial measurement unit, gyros, magnetometers or a compass. The system further includes an integrated navigation system to determine the location and orientation of the ladar system, and therefore an object's 3D location in geographic coordinates.

In general, in another aspect, the invention features a method for generating a 3D image of a scene including the following. Providing a transmitter comprising a pulsed laser generating optical pulses and illuminating the scene. The optical pulses have a pulse width of less than 20 nanoseconds and a pulse repetition frequency in the range of 20 kHz to 200 kHz. Detecting light scattered and reflected from the scene via a receiver comprising a sensor. The sensor includes one or more arrays of Geiger-mode avalanche photodiodes. Scanning a field-of-view (FOV) of the transmitter and receiver subsystem over a field-of-regard (FOR) of at least 30 degrees to generate data, with update rates faster than once per 5 seconds, resolution higher than 1 million resolution elements per second, and FOV aspect ratios of 1:10 to 1:1. Processing the data using a data processing computer that continuously generates 3D point clouds with latency less than 5 seconds, and generates alarms indicating anomalous activity within the scene. The scanning is provided by a polygonal mirror scanner and the polygonal mirror scanner comprises a number of facets in the range of 3 to 12 and the angles between each of the facet and a rotational axis of the polygonal mirror scanner are not all the same.

Advantages of the invention include one or more of the following. 3D ladar sensors enjoy the angular resolution of optical sensors, combined with a range resolution comparable with very good radars. The resulting 3D imagery is a direct measurement of the scene geometry, and provides a much better starting point for automated detection of anomalous activity. In addition, volumetric change detection can be used to detect objects moving through empty space. Because there is no clutter arising from a normally-empty voxel, detection can be accomplished with high confidence and very low false-alarm rate.

The details of one or more embodiments of the invention are set forth in the accompanying drawings and description below. Other features, objects, and advantages of the invention will be apparent from the following description of the preferred embodiments, the drawings and from the claims.

DETAILED DESCRIPTION OF THE INVENTION

The present invention relates to a system and method for wide-area surveillance that utilizes a rapid-update Geiger-Mode three-dimensional (3D) ladar. The rapid-update 3D ladar is used to detect anomalies based on short-time 3D geometric change detection.

Light Detection and Ranging (lidar or ladar) is a surveying technology used to measure the distance to a remote object by illuminating the object with a pulsed laser beam and measuring the time it takes to receive a reflected or scattered signal, i.e. time-of-flight (TOF) measurement. Differences in laser return times and wavelengths are used to construct a digital image of the remote object. A ladar system usually includes a laser source, a scanner and optics, sensors and electronics, and a positioning and navigation system. An example of a 3D ladar imaging system is described in PCT application WO2016/033036, filed on Aug. 25, 2015, contents of which are expressly incorporated herein by reference.

3D ladar sensors enjoy the angular resolution of optical sensors, combined with a range resolution comparable with very good radars. The resulting 3D imagery is a direct measurement of the scene geometry, and provides a much better starting point for automated detection of anomalous activity. In addition, volumetric change detection can be used to detect objects moving through empty space. Because there is no clutter arising from a normally-empty voxel, detection can be accomplished with high confidence and very low false-alarm rate.

Figure 1:
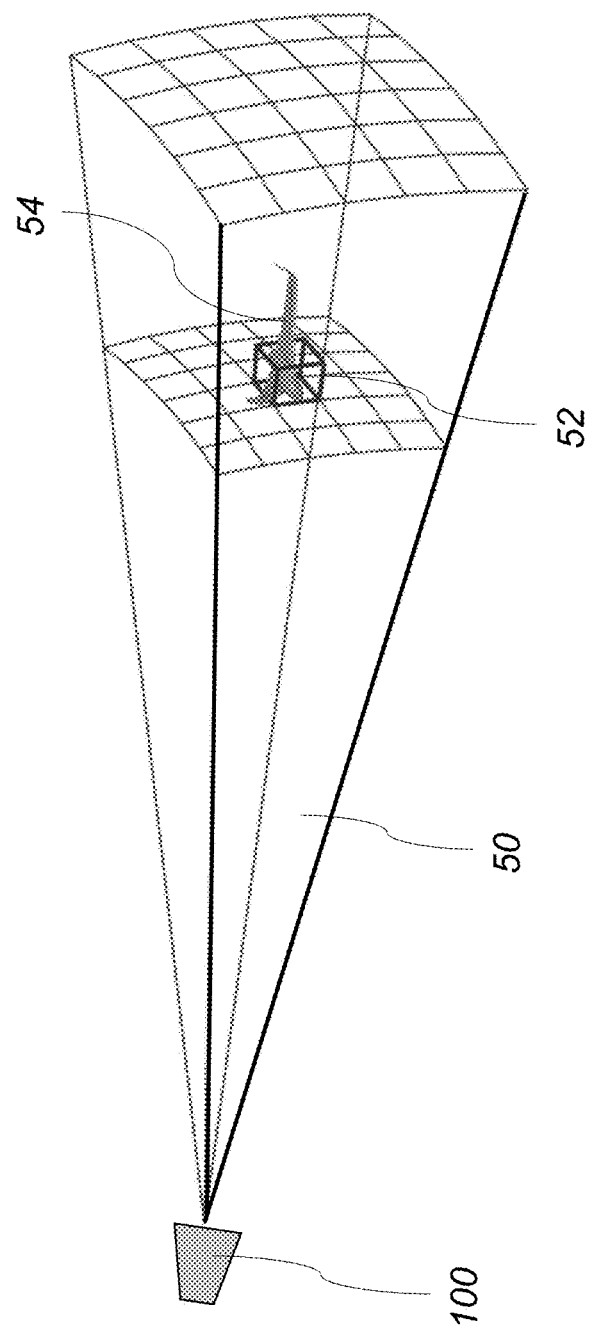
FIG. 1 is a schematic diagram of range-resolved wide-area surveillance that utilizes Geiger-Mode 3D ladar imaging.

In the past, ladar has been confined to applications with a narrow field of view, or a long acquisition time. Recent improvements in components and systems allow 3D measurement rates high enough to, for example, survey a 30 degree by 100 degree angular wedge, once per second, with enough sensitivity to detect a 50 cm target flying at a 1 km range, while simultaneously remaining eye-safe for observers beyond a reasonably short range. One key application of the present invention is the detection and tracking of small aircraft flying in sensitive airspaces in highly-cluttered urban areas. FIG. 1 indicates the technical advantage of 3D imaging for overcoming clutter in the detection of tracking of small aircraft. The ladar system 100 scans an angular wedge-shaped field of regard (FOR) 50. The entire volume probed by the ladar is conceptually partitioned into a mesh of volume elements ("voxels") 52. A given voxel 52 is ordinarily empty, so when an aircraft 54 is present it can be detected against a zero background. Because the background is absent, clutter in the resolution element is absent and false alarm rates can be radically reduced.

Figure 2:
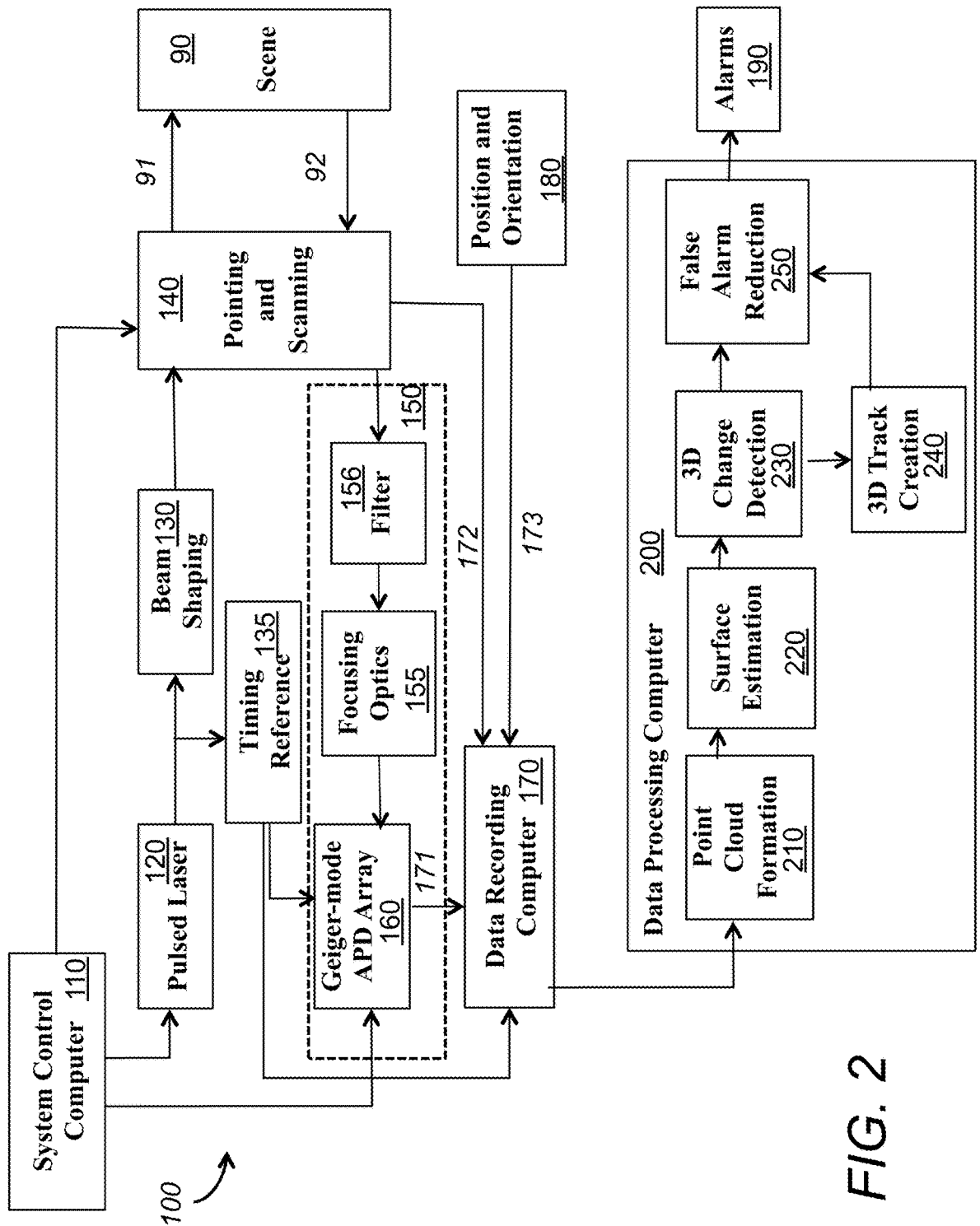
FIG. 2 is a block overview diagram of a system for wide-area surveillance that utilizes a Geiger-Mode 3D Ladar.
Figure 3:
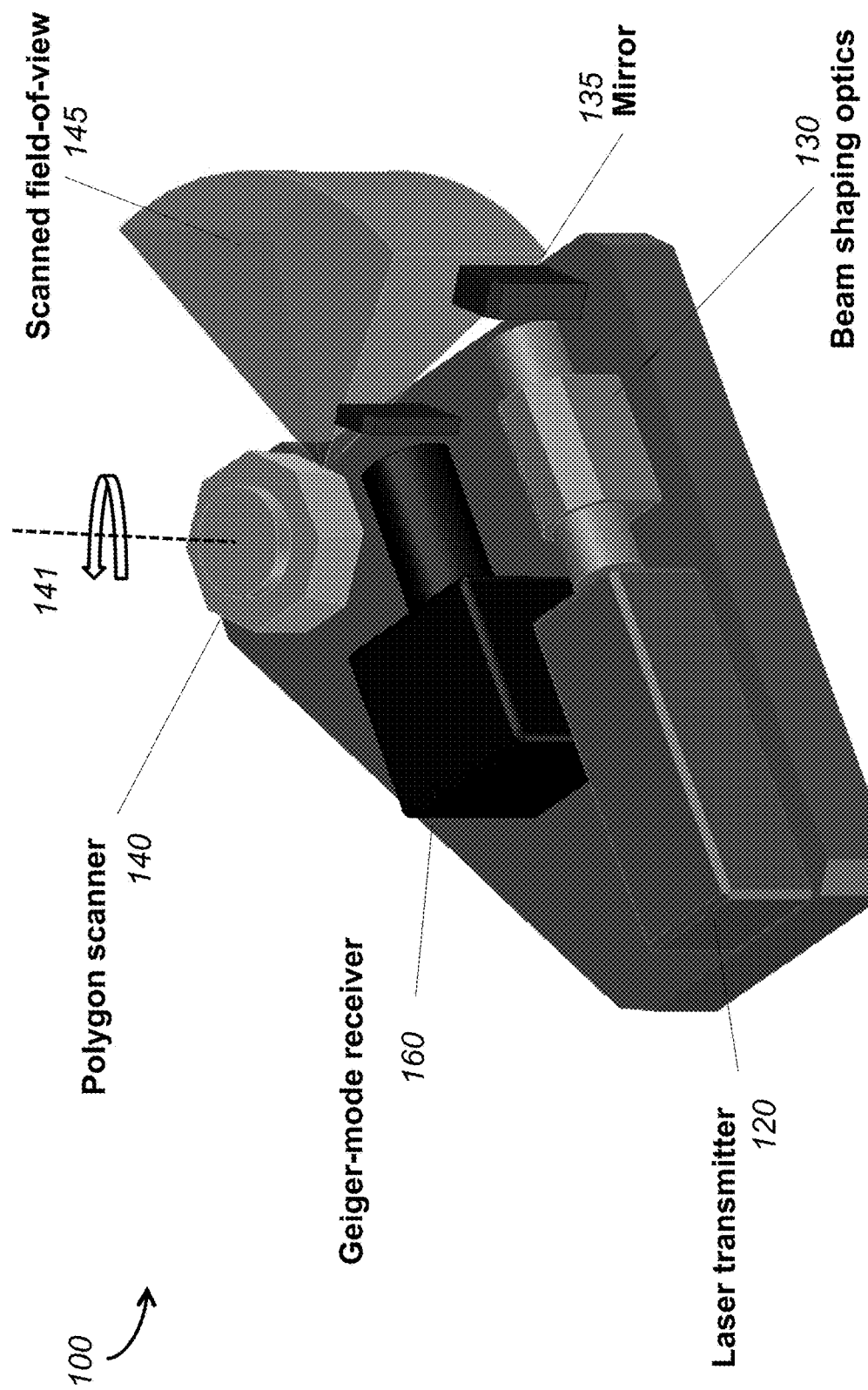
FIG. 3 is a schematic diagram of the optical system of FIG. 2.

Referring to FIG. 2 and FIG. 3, a wide-area surveillance system 100 that utilizes a rapid-update 3D ladar includes a system control computer 110, a pulsed laser 120, beam shaping optics 130, a pointing and scanning device 140, and a receiver 150. Receiver 150 includes focusing optics 155, filter 156 and a Geiger-mode avalanche photodiode (GmAPD) array 160. The pulsed laser 120 emits a pulsed laser beam that is shaped by the beam shaping device 130 and scanned via the scanning device 140 over a scene 90. The scattered and reflected light 92 from the scene 90 passes through the narrow-band filters 156 and the focusing optics 155 and is received by the GmAPD sensor array 160. In other embodiments receiver 150 includes a plurality of GmAPD sensor arrays 160. The output signal of the sensor array 160 is entered into a data recording computer 170 together with inputs from a position and orientation system 180. The output of the data recording computer 170 is entered into a data processing computer 200 where it is processed by algorithms providing point cloud formation 210, surface estimation 220, 3D change detection 230, 3D track creation 240 and false alarm reduction 250, as will be described below. The data processing computer 200 initiates alarms 190, based on the processing results.

The ladar system 100 of the invention simultaneously fulfills design requirements for rapid update, wide field-of-view (FOV), high resolution, acceptable eye safety, prompt processing, and low false alarm rates. These design requirements are the following:

Rapid update: for many applications the scene is imaged fast enough to reliably track objects. The time between updates is fast enough to allow unambiguous track assignments, no longer than the typical distance between moving objects scaled by the typical speed. For example, if people are walking at 1.5 m/s, and are typically separated by 1 m, the update rate is 0.7 seconds. If an airborne vehicle is flying at 20 m/s, and is typically at least 50 m from any other air vehicle, an update rate of 2.5 s is sufficient to maintain unambiguous tracks. Faster update rates allow acceleration estimates that can be used to better classify targets.

Wide Field-of-View (FOV): Surveillance sensors look over a wide area. Ground-based systems looking out from a high point over a crowd or secure area typically need azimuth extent exceeding 90 degrees, often a full 360 degrees. The vertical (elevation) extent is typically 20 to 40 degrees, depending on the mounting geometry. When looking down to the ground from an airborne platform such as an airplane or aerostat, it may be preferable for the field of view to be ±30 degrees in each of two directions. Shadowing effects from tall buildings and trees may lead to diminishing returns as the FOV is further increased.

High Resolution: Threats are detected and discriminated from non-threat objects in the scene. In this invention a primary discriminate is behavior of the object, meaning the object's location and motion through 3D space. An object such as a small Uninhabited Aerial Vehicle (UAV) is differentiated from nearby trees, buildings, or people if it is to be detected and tracked. The sensor resolution is therefore at least as tight as the separation between target objects and other objects in the scene. For example, the invention concerns ladars with 3D resolution (angle, angle, and range) of 50 cm at operating ranges of 1 km.

Acceptable Eye Safety: To be generally useful the system is safe for people and animals located beyond a relatively short keep-out range. The distance is tens of meters for a system mounted on a building roof, to a few hundred meters for an airborne sensor.

Prompt Processing: To be useful as a warning and cueing sensor, the raw data are processed promptly and alerts of threat objects are provided to system operators within a time scale that is short compared to the distance the threat must move from initial detection to a vulnerable location, scaled by the anticipated speed. For example, a UAV detected at a range of 1 km, flying at 30 m/s, is reported on a time scale short compared to 1000/30=33 seconds, dictating a maximum latency of approximately 3 sec.

Low False Alarm Rate: If warnings are issued too often, operators will ignore them. Typically the false alarm rate is balanced against the probability of detection using as inputs to the figure of merit the cost of missing a real threat and the cost of servicing a false alarm. Often one sensor is used for detection and another sensor, using a different sensing modality, is used to mitigate false alarms. Even when secondary sensors are employed, it is still advantageous to minimize the false alarm rate of the primary detection sensor.

The present invention fulfills these requirements by using the imaging ladar of FIG. 2. Pulsed laser 120 illuminates the scene 90 and scattered and reflected light 91 is detected using large arrays of avalanche photodiodes 160 positioned at the focal plane of an imaging system 155. The large number of detectors in each of the multiple arrays provides the necessary measurement rate. In one example, the arrays include 32×128, or 64×256 detectors. They are operated in Geiger-mode, and they can register the time of arrival of a single photon to sub-nanosecond precision. This high detector sensitivity enables the use of lasers 120 with moderate powers and moderate aperture sizes to accomplish the required speed and resolution while simultaneously remaining eye-safe for people in the scene. The raw data product from the imaging ladar is a 3D point cloud 210, in which each point represents an estimate of the location of a surface that scattered light back to the receiver. A scene 90 is typically composed of many static elements (such as buildings and terrain) interspersed with a small number of moving objects, some of which may be perceived as threats. The rapid-update 3D imaging system 100 is able to easily classify 3D points based on geometric change over time. For example, cars moving on a highway are easily segmented from the highway itself by exploiting the fact that the cars are sparse and positioned differently on each update cycle, but the road is static. Also, a small aircraft maneuvering through a crowded urban area is differentiated from the static buildings and utility wires by a similar analysis. The small aircraft is differentiated from moving cars and pedestrians by exploiting the fact that cars and pedestrians occupy a small "Human Activity Layer" (HAL) on the surface of the earth, as well as by comparison with activity statistics that are developed over longer time scales. The fast, photon-efficient 3D imaging capabilities of the Geiger-mode ladar systems, combined with wide-area fast scanning and geometric change detection algorithms, enable a new class of automated surveillance systems with high sensitivity and low false alarm rates.

The components of system 100 include the following, as shown in FIG. 2 and FIG. 3. Laser transmitter 120, produces short optical pulses of sufficient energy, at appropriate pulse repetition frequency, to accomplish the imaging objective. In one example, the laser pulse width is less than 5 nsec full width at half maximum (FWHM) and the pulse repetition frequency is in the range of 20 kH to 200 kHz. Included here is the optics to set the divergence of the beam to match the field-of-view of the receiver. The optics includes the beam shaping optics 130 and mirrors 135a, 135b. Imaging receiver 150 captures the return signal light, and focuses it onto one or more arrays of photo-detectors 160 that register single photons and measure the time-of-arrival with resolution better than 5 nsec. Pointing and scanning system 140, rapidly and repetitively directs the narrow field-of-view (FOV) of the ladar sequentially across a wide angular subtense 145. The area is scanned at an update rate fast enough to unambiguously track moving threats. In one example, example, a 1 Hz update rate is appropriate for small UAVs. Data processor 200 generates 3D point clouds via the point cloud formation algorithm 210 from the raw photo-detections 171 from the ladar receiver 160 and raw pointing information 172 from the scanning system 140, and assigns 3D coordinates to locations where it is probable that a surface exists that scatters laser photons back to the receiver via the surface estimation algorithm 220. Threat detector and tracker 240, discriminates a potential threat object from non-threat objects in the scene based on one or more criteria, and issues alerts 190 to the operator and/or other sensors. Both the outputs of the 3D change detection algorithm and the 3D track creation algorithm pass through a false alarm reduction algorithm 250 prior to being forwarded to the alarm component 190.

The characteristics of each component of system 100 are designed together to create a system with the necessary capabilities. An exemplary system for wide-area surveillance is described below. In other examples, the system requirements vary with application and may be substantially different from the exemplary set of requirements.

Exemplary System for Wide-Area Surveillance:

Suppose an object of size b=50 cm is to be reliably detected at a maximum range of $R_{max}$=1 km. The return signal from the object is proportional to the area $b^2$ and the reflectivity ρ at the wavelength used by the ladar. For illustrative purposes, it is assumed the Lambertian reflectivity to be ρ=0.2.

The object is to be reliably differentiated from other objects located beyond a minimum separation distance s. For the detection of threats such as small UAVs and pedestrians moving close to buildings and trees, range resolution on the order of s=1 m is expected to be sufficient. The angular resolution requirement is $\Phi=s/R_{max}$=1 mrad.

The angular wedge to be monitored has angular width $\theta_{az}$ and angular height $\theta_{el}$. For illustrative purposes, take $\theta_{az}$=100 deg and $\theta_{el}$=30 deg. The number of angular resolution elements is $N_T=N_{az} N_{el}$=9.2×10$^5$, where $N_{az}=\theta_{az}/\Phi$=1745, and $N_{el}=\theta_{el}/\Phi$=524.

The scene is to be repeatedly surveyed at an update rate U=1 Hz. The rate should be faster when objects to be tracked are expected to be closer together and/or when they are expected to be moving faster.

Laser:

In this example, the laser characteristics are chosen as follows:

Pulse width: The range resolution of the ladar is determined by the combination of the laser pulse width and the receiver timing resolution. The range resolution is important because it sets the minimum distance that can be resolved between a potential threat object (e.g. UAV) and a static surface behind it, or between two threat objects. 3D imaging provides a technical advantage over 2D imaging when a threat object can be detected in the absence of clutter within the same 3D resolution element. This necessitates laser pulse widths on the order of τ<2s/c=6 nsec, where s is the clutter separation distance defined above, the speed of light is c=3.0×10$^8$ m/s, and the 2 accounts for the round-trip distance. Narrower pulse widths are preferable in order to keep the system range resolution tight (down to the detector timing resolution), whereas wider pulse widths reduce the peak optical intensity in the laser, simplifying the design and often increasing reliability while reducing cost and weight.

Pulse repetition frequency (PRF) F is limited primarily by two factors. Faster PRF's allow lower peak power at a given average power level, thereby simplifying laser design and often reducing cost. If the PRF is high enough so the inter-pulse period is less than the round-trip time from the sensor to the target and back, system complications are introduced including the need for algorithms to determine which pulse gave rise to a given return, and the blinding of the sensitive receiver by stray light scattered during an outgoing pulse. For example, assuming a maximum range-to-target of $R_{max}$=2 km, the PRF should be kept below $F_{max}=c/2R_{max}$=75 kHz. If the receiver is operated in a framed mode, in which the entire detector array is read out at one time, the laser PRF should be matched to the frame rate. A typical maximum frame rate is 90 kHz for currently available detector arrays. Methods exist in the prior art for disambiguating the range when the inter-pulse period is short.

Average power, $P_{avg}$, is the product of the number of resolution elements per second that must be surveyed, $N_T$U, and the minimum transmitted energy required per resolution element, $E_{min}$. Given reasonable assumptions about the system losses, as well as the number of photo-detections typically required to reliably detect a surface in the presence of shot noise and background, $N_{det,req}$=10, one can easily calculate this minimum transmitted energy. The system losses include:

a. the atmospheric transmission $T_{atm}$ (e.g. 0.7)
b. the transmission efficiency of the laser beam-shaping optics $T_{Tx}$ (e.g. 0.7)
c. the transmission efficiency of the receiver optics $T_{Rx}$ (e.g. 0.5)
d. the transmission $T_{BP}$ of the narrow bandpass filter used to reject background light (e.g. 0.8)
e. the unoccluded fraction of the receiver optics $T_{obs}$ (e.g. 0.7 for monostatic arrangement)
f. the fraction of the transmitted light that illuminates the receiver field-of-view, $\eta_{illum}$ (e.g. 0.7)
g. the photon detection efficiency of the detector array, $\eta_{PDE}$ (e.g. 0.25)

The return loss (geometric spreading loss) for a Lambertian reflector is $\rho D^2/4R^2$ for a receiver aperture of diameter D (e.g. D=3.6 cm, as explained below). The energy per photon is $E_0=hc/\lambda$=1.9×10$^{-19}$ J at λ=1064 nm. When a target is smaller than the system angular resolution, the fraction of the transmitted energy, per resolution element, that illuminates the target is $b^2/R^2 \Phi^2$. The minimum energy $E_{min}$ needed to detect the object is obtained from the relation $$E_{min}T_{Tx}T_{atm}^2(b^2/R_{max}^2\Phi^2)\rho(D^2/4R_{max}^2)$$
$$T_{Rx}T_{BP}T_{obs}\eta_{illum}\eta_{PDE}=N_{det,req}E_0$$

Given the example parameters, $E_{min}$=5.3×10$^{-6}$ J and $P_{avg}=N_T U E_{min}$=4.9 W. When the scanning strategy includes significant overlap, and therefore interrogation of the same spot multiple times during the scan period $U^{-1}$, the average power requirement increases. Likewise, when the data collection duty cycle is less than unity, further increases in average power are required.

The wavelength of the laser is typically chosen based on the availability and performance of system components. There is a preference for wavelengths that are absorbed in the cornea of the eye instead of the retina, thereby allowing much higher optical intensities to be safe. In the current invention, eye-safety concerns are significantly mitigated by the fact that such low signals are required by the photon-sensitive detectors in order to make a measurement. The beam is typically significantly divergent, and it is scanned rapidly so that exposure times are very short. For example, the beam divergence might be 12.6 mrad and the duration of the exposure at any given point is $\tau_{exp}$=(12.6 mrad/2π)/($N_{facets} N_{shifts}$ U)=81 µsec, given the scanning parameters outlined below. The Nominal Ocular Hazard Distance (NOHD) is 6.5 m for unaided viewing; it is safe to scan a crowded urban scene from a rooftop.

In one example, a laser used in this system is the VGEN-SP-NL-40-10 fiber laser from Spectra-Physics, or the WedgeHF-1064 from BrightSolutions.

The beam shape in the far field is matched to the receiver FOV, which might be rectangular or elliptical. The beam shaping function 130 is accomplished by use of spherical optics, cylindrical optics, anamorphic prism pairs, diffractive optical elements, holographic optical elements, or any combination thereof.

Receiver:

The ladar receiver 150 in the present invention includes imaging optics 155, 156 and one or more arrays of photo-detectors sensitive to single photons 160. Examples, of such arrays are manufactured by Princeton Lightwave Inc., Boeing Spectrolab, or MIT Lincoln Laboratory, among others. Multiple detector arrays are configured to increase the total number of photo-detectors and hence the interrogation rate.

Multiple arrays are used to mitigate detector blocking effects that often occur when the scene contains a wide dynamic range of return signal levels, as happens when scene elements are at widely-varying ranges. Alternatively, multiple arrays are configured to increase the field of view beyond that of a single array using, for example, the approach described in the patent application PCT/US2015/046682, the contents of which are expressly incorporated herein by reference.

In operation, a small fraction of the light scattered by a distant object is captured by an imaging system with effective aperture diameter D and focal length f. The light is focused onto an $N_x \times N_y$ array of photodetectors having pixel pitch $\Lambda$. The angular width of the pixel field-of-view (FOV) is $\phi = \Lambda/f$, which is smaller than the clutter separation $\Phi$. Typically, the photo-detectors in the array are sensitive to light arriving within a light cone whose width is limited by how efficiently the microlens array couples light to the active area of the detectors. The width of this acceptance cone is parameterized by a minimum focal ratio (f-number), $f_{APD}$. In order to capture the most signal light, the aperture diameter is typically maximized, so $D = f/f_{APD} = \Lambda/\phi f_{APD}$. An example system has $f_{APD} = 7$, $\Lambda = 50$ μm, $\phi = 200$ μrad, $D = 3.6$ cm, and $f = 250$ mm. Commercially-available Geiger-mode Avalanche Photo Diode (GmAPD) arrays have $f_{APD} = 7$ and $\Lambda = 50$ μm.

In this example, the receiver characteristics are chosen as follows:

Photon detection efficiency (PDE) parameterizes the number of detected photo-electrons per photon incident on the focal plane. The value depends on the operating conditions, such as the anode bias voltage, as well as fabrication parameters. At higher bias voltages the PDE is increased at the cost of higher dark count rates and higher crosstalk. The choice of operating parameters is tailored to the specific imaging task.

Crosstalk occurs when the avalanche process in one pixel, which can result in weak photo-emission, leads to the occurrence of an avalanche in another pixel somewhere in the array. Most often the crosstalk occurs within a distance of several pixel spacings from the original avalanche, but it can occur anywhere. The crosstalk process is fast, and crosstalk-induced avalanches are typically registered within a few nanoseconds. Because this noise source is somewhat localized in space and highly localized in time, it is especially problematic when small objects are to be detected near large objects located at similar range. Crosstalk is reduced through device design and by lowering the bias voltage, thereby reducing the amount of charge that flows during an avalanche event and the resulting photo-emission. Models of the crosstalk probability are used in processing to help differentiate false alarms from real surfaces.

Timing resolution is a combination of the timing jitter inherent in the device as well as the choice of device clock frequencies and resulting timing quantization. Because of the finite dynamic range of the timing circuitry (e.g. n=13 bits), the maximum range extent (also known as "gate width") is $(c/2) \tau_0 2^n$, where the timing resolution is $\tau_0$. Choosing $\tau_0 = s/c = 3$ nsec gives a maximum range extent of 3.7 km in this example.

Pixel FOV is chosen as a tradeoff between the complexity of the scanning system and the required laser power. The scanning system must rapidly position the array FOV over a large number of sites. The effective number of sites is $N_{sites} = \theta_{az} \theta_{el}/N_x N_y \phi^2$. As the number of sites the scanning system must address within the fixed scan period $U^{-1}$ is increased, scanning system complexity and power increases.

On the other hand, the laser power requirement is proportional to $\phi^2$, since $D \propto \phi^{-1}$ and a larger aperture captures more of the returned light, thereby lowering laser power requirements. Laser volume and electrical input power is roughly proportional to $P_{avg}$. A reasonable tradeoff has been achieved when there is an approximate match of the size, weight, and power (SWaP) of the scanning subsystem and the laser. Of course, to achieve the imaging requirements, the pixel FOV must be less than the clutter separation, $\phi \leq \Phi$.

Number of pixels is adjusted by choosing an array of a different size, or by utilizing multiple arrays in the ladar. Combinations of beam splitters between the focusing lens and the focal plane allow multiple arrays to share a common field-of-view. Alternatively, adjacent tiling of the arrays in the focal plane allows system FOV to be increased. Because of the practical constraints of packaging, physical abutment might be impossible, and one might use an optical re-imaging strategy to achieve seamless abutment of arrays across the focal plane. One might use a combination of these approaches to, for example, share the light from the more intense center of the illumination beam across two arrays with identical FOV, and direct light from the edges of the illumination profile to each of several arrays.

The number of pixels must be sufficient to meet the imaging requirements. Typically Geiger-mode ladar is operated in the so-called "linear regime", where the signal from a typical object in the scene causes a pixel to fire no more than about 20% of the time. If the probability of firing is substantially higher, then intensity information is sacrificed because the generation of one photo-electron is indistinguishable from the generation of multiple photo-electrons. If the probability of firing is substantially lower than 20%, then noise due to background and crosstalk can become a significant issue because more integration time is needed to detect enough photo-electrons to reliably declare the presence or absence of a surface in the scene.

To determine the number of pixels required to fulfill the imaging requirements, a nominal signal rate $N_{pe}$ (number of photo-electrons detected per photo-detector pixel per laser pulse) is chosen for the weakest reflectors at the longest range. For example, take $N_{pe} = 0.2$ for target of area $b^2$, reflectivity $\rho_0 = 0.2$, at distance $R_0 = R_{max} = 1$ km. As stated above, the system is designed so that the average number of detections per target object is $N_{det,req}$, thereby assuring reliable detection of objects in the presence of shot noise and weak background. The minimum number of interrogations of each resolution element is therefore $N_{det,req}/N_{pe}$. The detector array is capable of an interrogation rate $\Gamma = N_{pixels} F$ for frame rate F and $N_{pixels} = N_x N_y$. The required interrogation rate is $\Gamma_{req} = N_T U(\Phi R_{max}/b)^2 (N_{det,req}/N_{pe})$ where the number of angular resolution elements is $N_T$ and the fraction of photo-detectors imaging a small target within a larger resolution element is $(b/R_{max} \Phi)^2$. Equating these interrogation rates gives the minimum number of pixels $N_{pixels} \geq N_T U(\Phi R_{max}/b)^2 N_{det,req}/F N_{pe}$. In the example case, $N_{pixels} \geq 2.6 \times 10^3$, and a single 32×128 array operating at F=70 kHz is sufficient.

Figure 12:
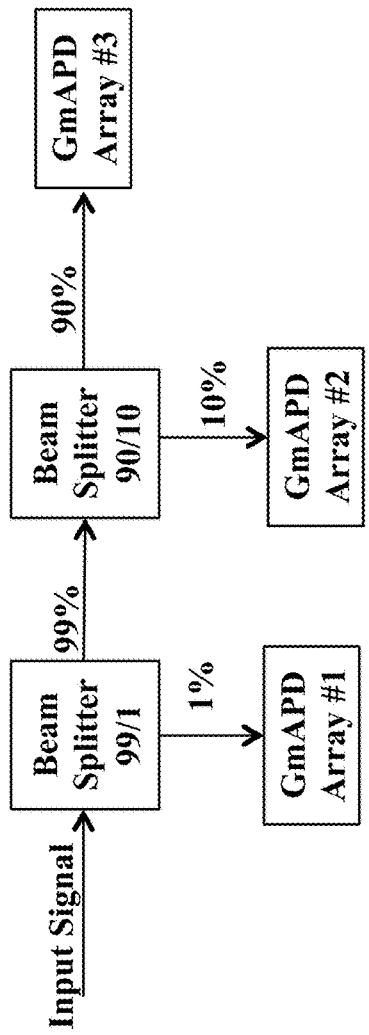
FIG. 12 depicts an example of the accommodation of wide dynamic range.
Figure 12:
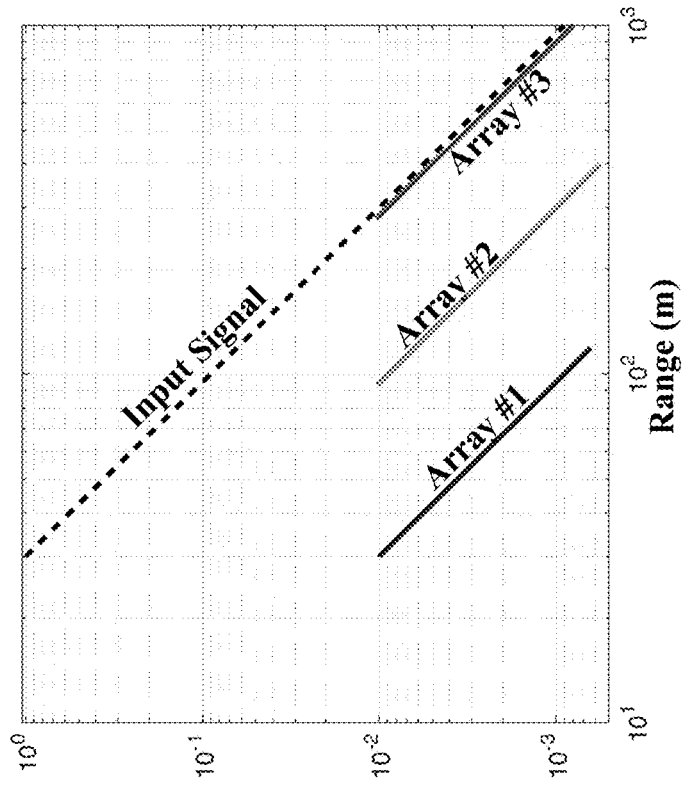

Dynamic range accommodation is accomplished by splitting the received light unequally onto multiple arrays, each of which shares a common FOV but which is activated at a different time relative to the transmitted laser pulse, as shown in FIG. 12. The problem to solve is the so-called "blocking" that occurs after an avalanche occurs; the photo-detector is not sensitive again until it has been reset, a process that may require hundreds of nanoseconds. If a photo-detector pixel images two objects that are at very different ranges, the return from the closer one can be much stronger than the return from the farther one since the return energy is inversely proportional to the range squared. Therefore even a small object up close, such as a suspended electrical utility wire, can render a photo-detector useless for detecting other objects at farther distance.

The approach taken in the present invention is to split the received light unequally onto two or more detector arrays using unequal beam splitters. For example, a pellicle with 99%/1% splitting ratio is placed after the focusing optic. The detector array in the 1% path is activated early and detects light from closer objects, which is brighter. For example, the detector is activated at a time corresponding to a range of $R_{short}$=30 m. In the 99% path there is a 90/10 splitter. The detector in the 10% path is activated at a range $R_{med}$=100 m. The remainder of the light is imaged onto a detector activated at a range $R_{long}$=300 m. In this way each detector array need only accommodate an intensity dynamic range of approximately 10, while the system accommodates a dynamic range of $(R_{max}/R_{short})^2$=1111. This capability comes at the expense of needing three arrays instead of one, and slightly increased system complexity.

An alternative method to accommodate large dynamic range is to time-multiplex the detection. The scene is interrogated multiple times per scan period $U^{-1}$, and the photo-detector array is activated each time at a different starting range. The laser pulse energy is modulated in concert with the range at which the photo-detectors are activated.

Scanner:

The function of the scanning system is to rapidly and accurately direct the narrow FOV of the ladar across the wider field-of-regard (FOR) of the system. The scanner performs reproducibly to the level of a fraction of the intended angular resolution, i.e., $\Phi/3$.

Figure 4A:
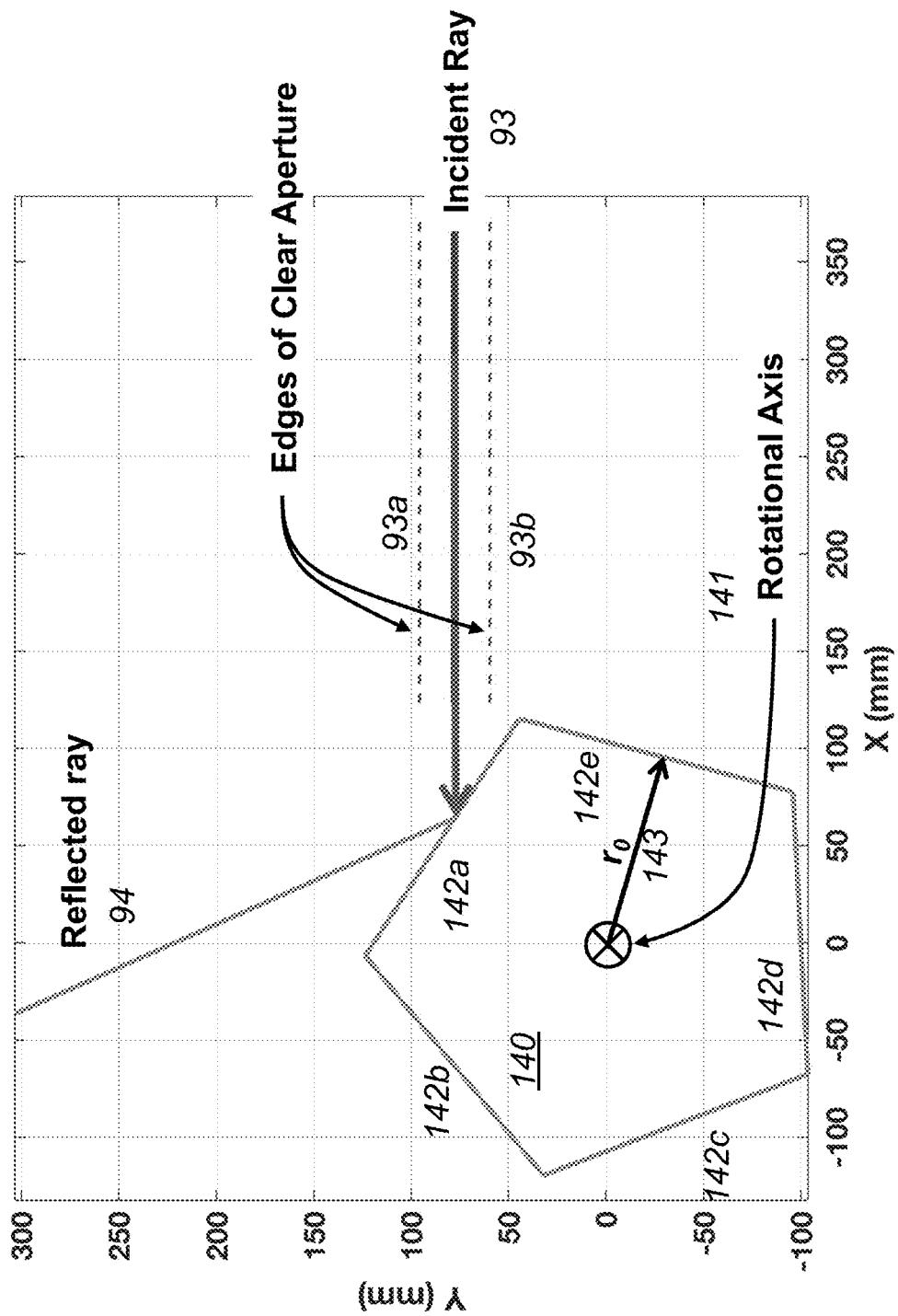
FIG. 4A is a top view of the polygonal scanner of FIG. 3.
Figure 4B:
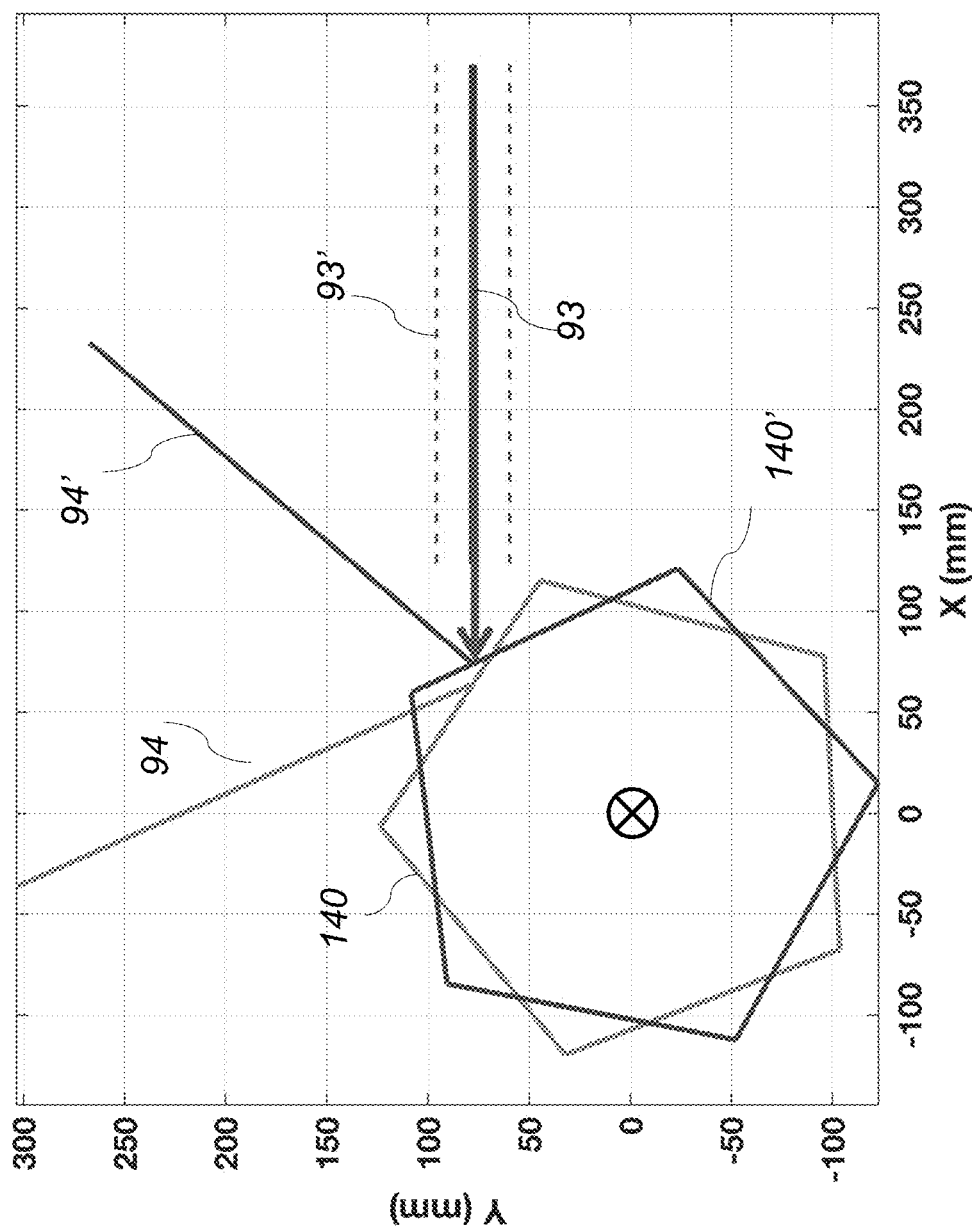
FIG. 4B is a top view of another position of the polygonal scanner of FIG. 3.

The present invention uses a spinning polygonal mirror 140 with spin axis 141 approximately perpendicular to the ladar line of sight, as shown in FIG. 4a and FIG. 4b. An alternative arrangement is for the incident ladar line-of-sight to be tilted substantially away from a direction perpendicular to the spin axis 141. The remainder of the description assumes the substantially-perpendicular configuration. If the reflective face of the polygon 142a is parallel to the spin axis, then as the polygon rotates through an angle $\alpha$, the reflected line of sight is swept through an angle $2\alpha$. To achieve a system FOR angular width $\theta_{az}$, the polygon rotates through an angle $\theta_{az}/2$ while the ladar is reflected off a single facet, implying that the angular width of a facet is at least $\theta_{az}/2$ and the number of facets $N_{facets}$ on the polygon is less than $4\pi/\theta_{az}$. For the example system with $\theta_{az}$=100 deg, $N_{facets} \leq 7$.

The size of the polygon 140 is another adjustable parameter. Clearly the thickness (dimension parallel to the spin axis) should be at least as large as the aperture diameter D so no light is wasted. Note that the aperture might be elliptical instead of simply circular. In that case the thickness of the polygon must match the corresponding axis of the ellipse. The radius $r_0$ 143 from the spin axis 141 to the center of the facet 142e is chosen as a trade-off between data collection efficiency and preference for a compact mechanical structure. The data collection efficiency of the system is compromised in those polygon rotation positions where the ladar aperture overlaps a corner of the polygon. Here the aperture is looking in multiple directions, and the laser is also typically pointed in multiple directions. The angular width of this compromised region is approximately $\alpha_{corner}$=2 $\tan^{-1}(D/2r_0)$. If these corner regions are excluded from the data collection, the efficiency is $\eta_{corner}$=1−$N_{facets}$ $\alpha_{corner}/2\pi$. Moreover, the usable fraction of each facet is reduced so the angular width of each facet must be increased in order to maintain a desired azimuth FOR. When these finite size effects are included, $N_{facets} \leq 4\pi \eta_{corner}/\theta_{az}$.

The system designer might stipulate that the polygon radius $r_0$ will be chosen so that $\eta_{corner} \geq 0.7$, and therefore, for this example design, $N_{facets} \leq 5$ and $r_0 \geq D/2 \tan(\pi(1-\eta_{corner})/N_{facets})$=9.4 cm.

The distance from the spin axis to the corner of the polygon is $r_c = r_0/\cos(\pi/N_{facets})$.

Figure 5:
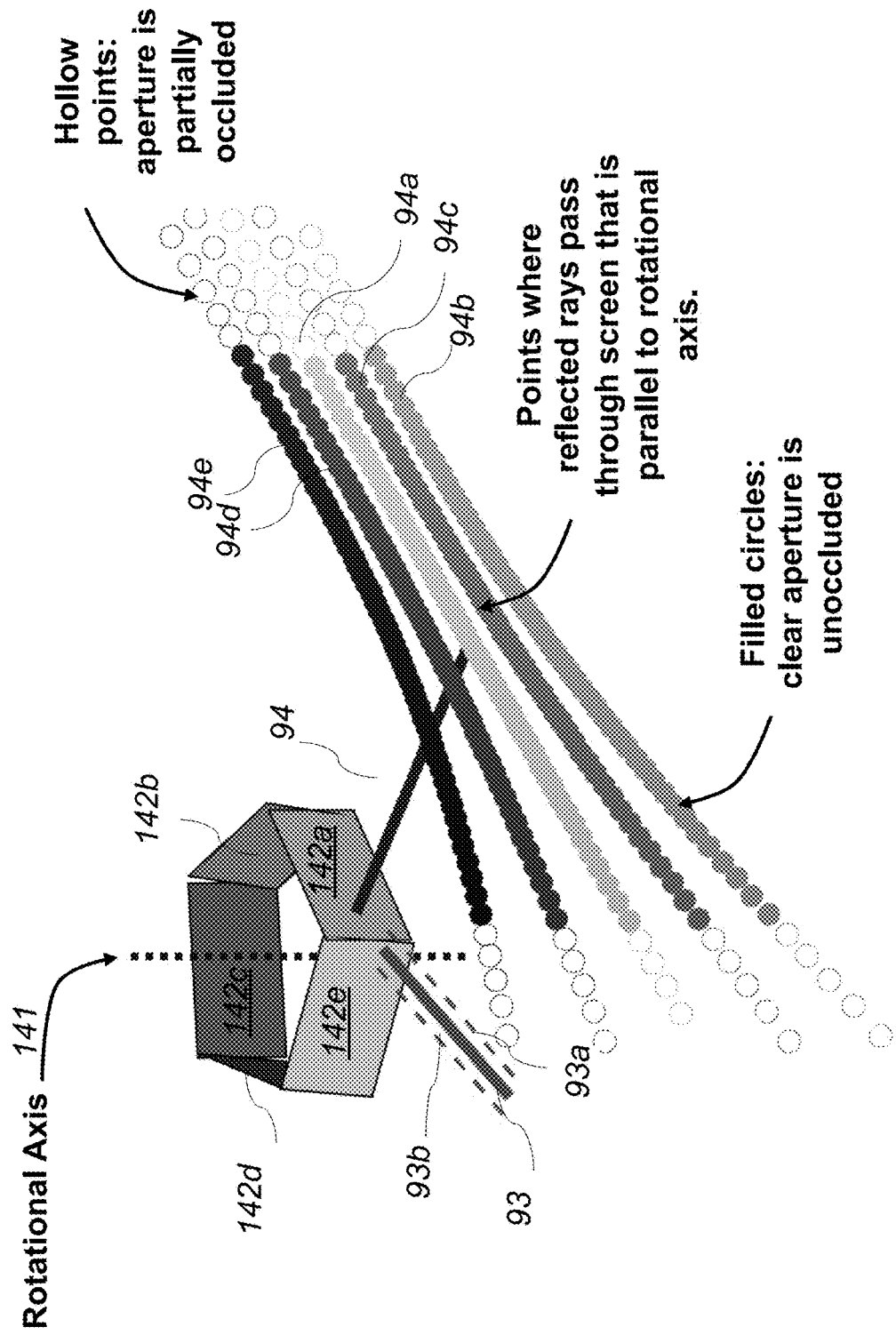
FIG. 5 is a perspective side view of the polygonal scanner of FIG. 3.
Figure 6:
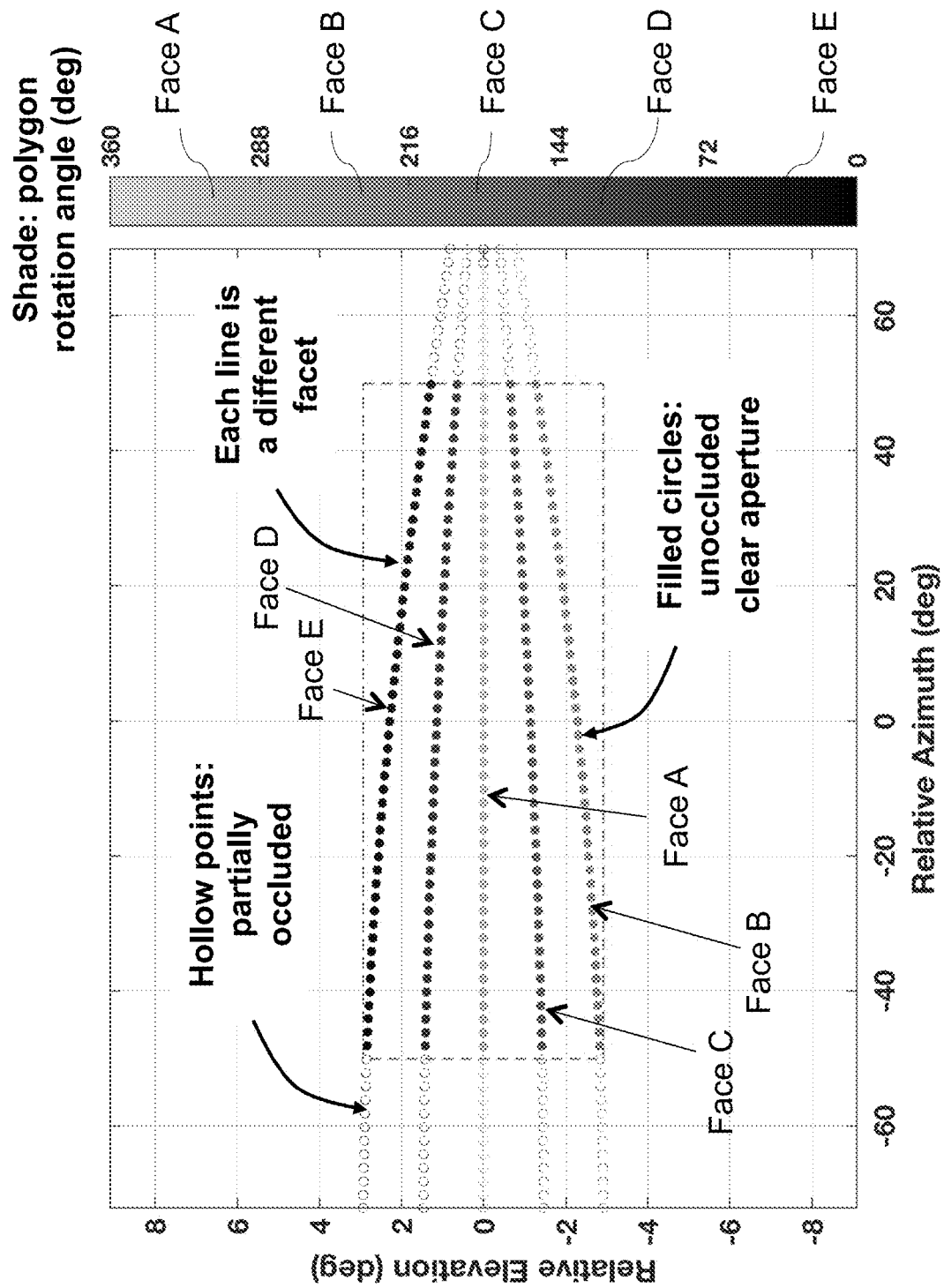
FIG. 6 depicts a far-field scan pattern of the polygonal scanner of FIG. 3.
Figure 7:
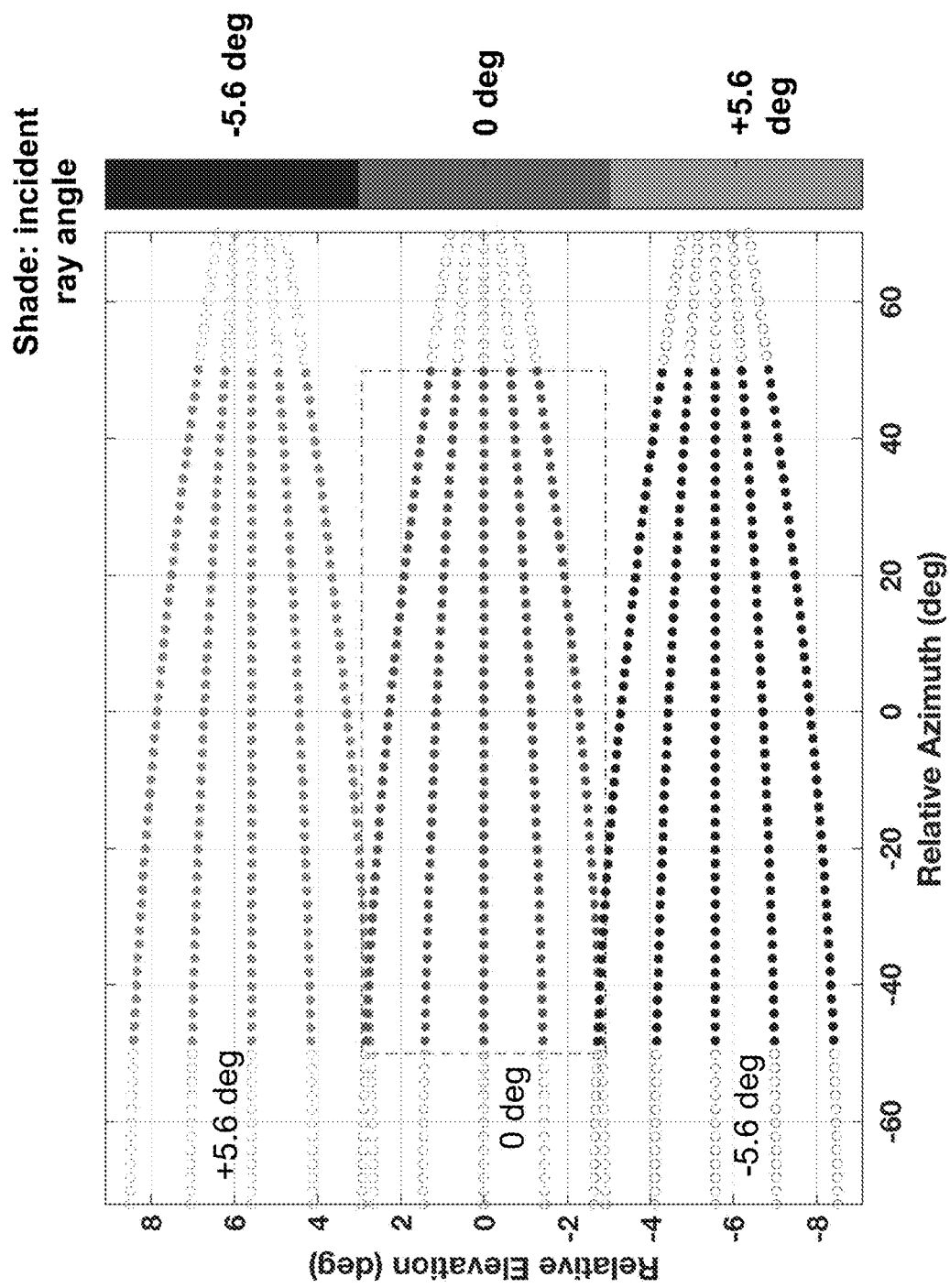
FIG. 7 depicts a stepped incident ray scan pattern of the polygonal scanner of FIG. 3.

If all the facets 142a-142e are parallel to the spin axis 141, the ladar line-of-sight will be scanned across an identical path $N_{facets}$ times per revolution. However, by tilting each facet 142a-142e by a slightly different angle relative to the spin axis 141, the ladar line-of-sight (LOS is swept over (a maximum of) $N_{facets}$ different trajectories per revolution, each of which is called a swipe. To scan a wedge of angular space, each of the facets are tilted a different amount so that the ladar LOS is reflected into a series of angles spaced by $\beta$; for example, with $N_{facets}$=5 and $\beta$=2 deg, the LOS angles are −4, −2, 0, 2, and 4 degrees. As the polygon spins, the swipes are not equally spaced straight lines, but rather slightly non-parallel arcs. Straightforward ray-tracing calculations yields the LOS swipe trajectories. Referring to FIG. 5 the five facets of the polygon are of 142a, 142b, 142c, 142d, 142e. The optical axis of the incident ladar optical system is shown the solid line 93. The two dashed lines 93a, 93b indicate the edges of the clear aperture of the ladar. The doted lines indicate where the reflected ray intersects a distant plane as the polygon spins, each dot representing 1 degree of motion of the polygon. The five facets 142a, 142b, 142c, 142d, 142e correspond to the five rows of dots 94a, 94b, 94c, 94d, 94e, or swipes. Solid dots indicate angles where the entire ladar clear aperture fell on a single face of the polygon, whereas hollow circles indicate that the clear aperture was split over two facets. FIG. 6 further illustrates the directions of the reflected rays. The color of the dots indicates the rotation angle of the polygon around its spin axis, and as in FIG. 5, solid dots indicate that the full clear aperture of the ladar falls on a single facet. The problem of arcing swipes is illustrated.

Figure 8:
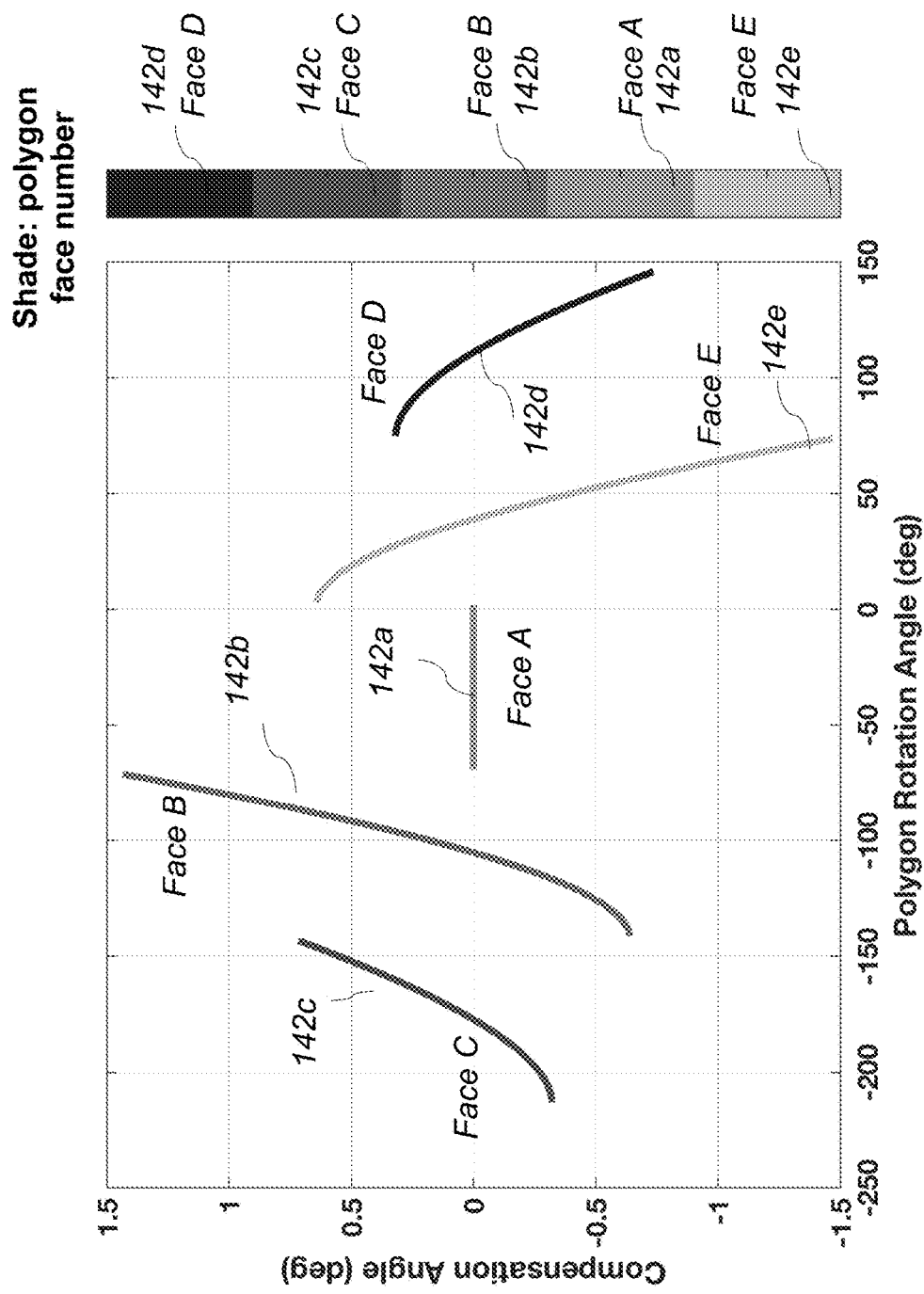
FIG. 8 depicts an example of a correction to the incident ray angle for the polygonal scanner of FIG. 3.
Figure 9:
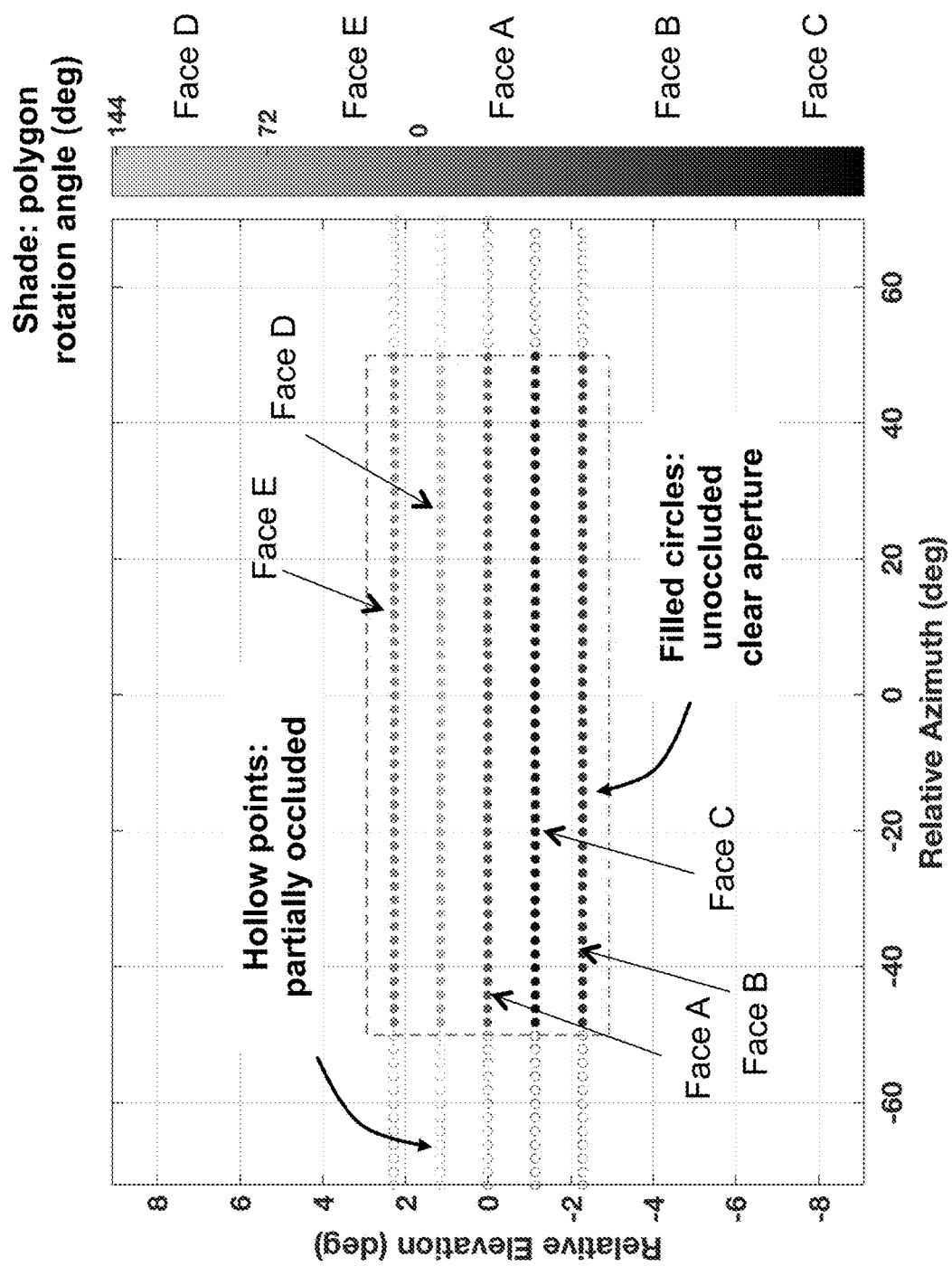
FIG. 9 depicts a corrected far-field scan pattern of the polygonal scanner of FIG. 3.

The swipes can be made parallel by the application of a slight angular tilt of the incident ray 93 that is synchronized to the rotation of the polygon. FIG. 8 indicates one example of the small compensation angle that is applied to the incident ray 93 as a function of the rotation angle of the polygon. The indicated trajectories are low-order polynomials generated numerically, but other methods could also be used to generate the compensation waveforms. For example, analytic or numerical optimization approaches could be used. FIG. 9 shows how the system in FIG. 6 is modified as a result of tilting the incident ray 93 according to the compensation angular waveform in FIG. 8. The swipes are substantially straight and parallel, and so the scene is imaged efficiently and as intended.

If the desired angular height $\theta_{el}$ of the region to be scanned is small, then the angular spacing between the facets can be $\beta = \theta_{el}/N_{facets}$. A single revolution of the polygon sweeps the ladar over the entire field of regard. However, if the angular height is large, such that the vertical FOV of the array, $N_y\phi$, is less than the swipe spacing $\beta$, then gaps in the scan pattern will exist. A solution to the problem is to use multiple revolutions of the polygon, each conducted with a slightly different incidence angle of the sensor LOS. These additional swipes are used to fill in the gaps.

One choice of parameters is to interdigitate swipes from successive rotations of the polygon; the facet spacing $\beta$ is greater than the sensor FOV $N_y\phi$. Another choice is to place all swipes from a single revolution of the polygon close together in a block, and step the incident ray angle by a large amount, $N_{facets}\beta$, for successive revolutions. There are trade-offs for each approach, depending on the dynamics of the scene to be imaged and the capability of the actuator used to deflect the incident ray.

Consider the interdigitated approach. In the example design, $\beta=6$ deg, but $N_y\phi,=1.47$ deg, clearly resulting in large gaps between the swipes. The problem is addressed by shifting the ladar LOS slightly for each revolution of the polygon. In one example, this is accomplished by using a pair of prisms in the Risley configuration, or by using a movable mirror between the ladar and the polygon. The ladar LOS is shifted by small angles away from perpendicular to the polygon spin axis. The number of angular shifts required to eliminate gaps and instead achieve a swipe-to-swipe overlap fraction $\gamma$ is $N_{shifts} \geq \beta/N_y\phi(1-\gamma)$. For this example design, assuming $\gamma=0.15$, $N_{shifts} \geq 4.8$. The implication is that the polygon rotation rate must be $N_{shifts}U$. The movable mirror must shift the ladar LOS among $N_{shifts}$ positions, separated by an angle $\beta/(N_{shifts}-1)$, which for this example design is 1.2 deg. In order for the shift to be accomplished during the down-time associated with a polygon corner transiting the clear aperture, the settling time of the mechanism used to shift the LOS should be less than $\tau_{shift} \leq \alpha_{corner}/2\pi N_{shifts}U$, which for this example design is $\tau_{shift} \leq 12$ msec. A flexure-based galvo scanner easily meets these requirements.

Figure 10:
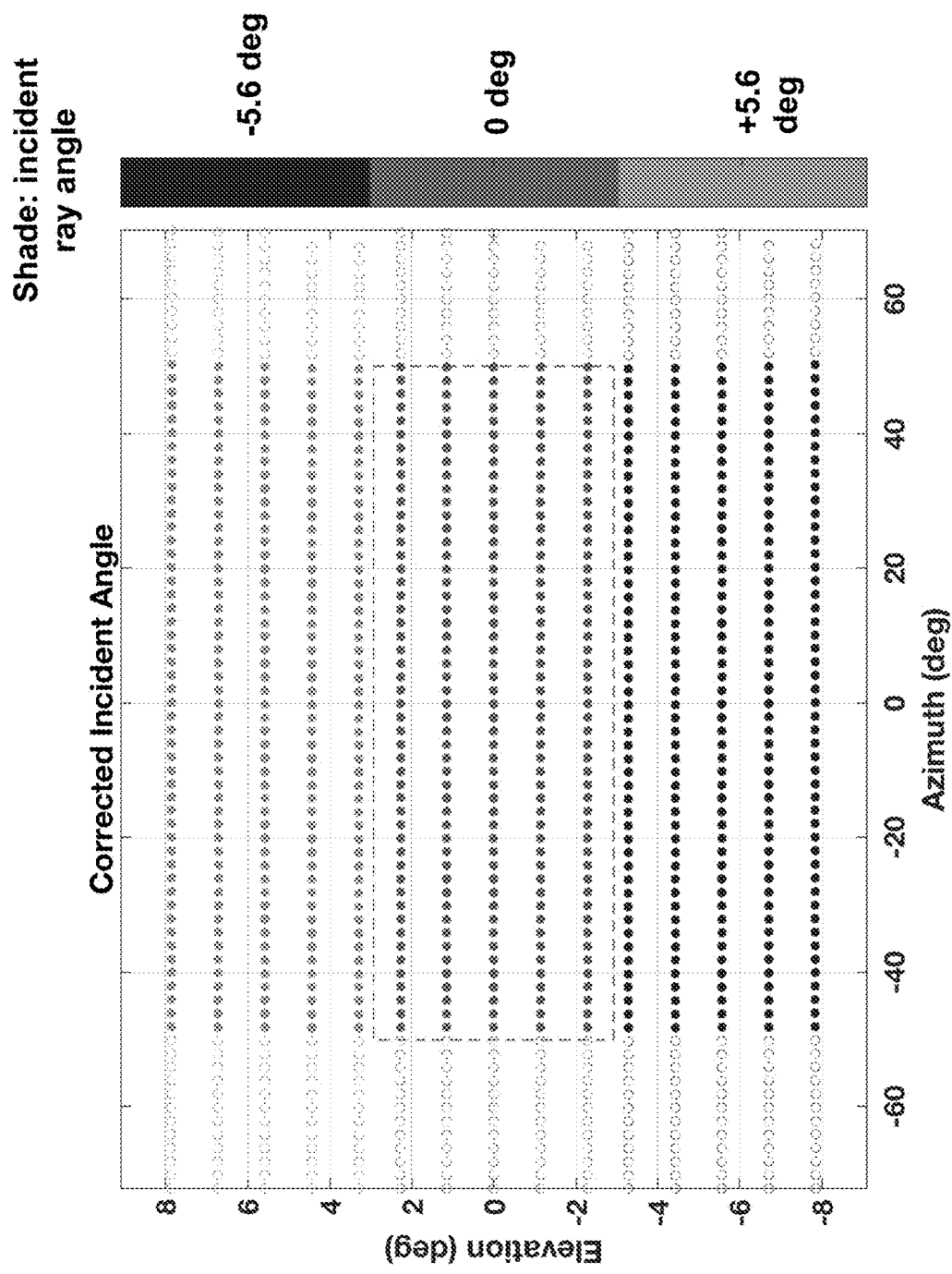
FIG. 10 depicts a corrected stepped incident ray scan pattern of the polygonal scanner of FIG. 3.
Figure 11:
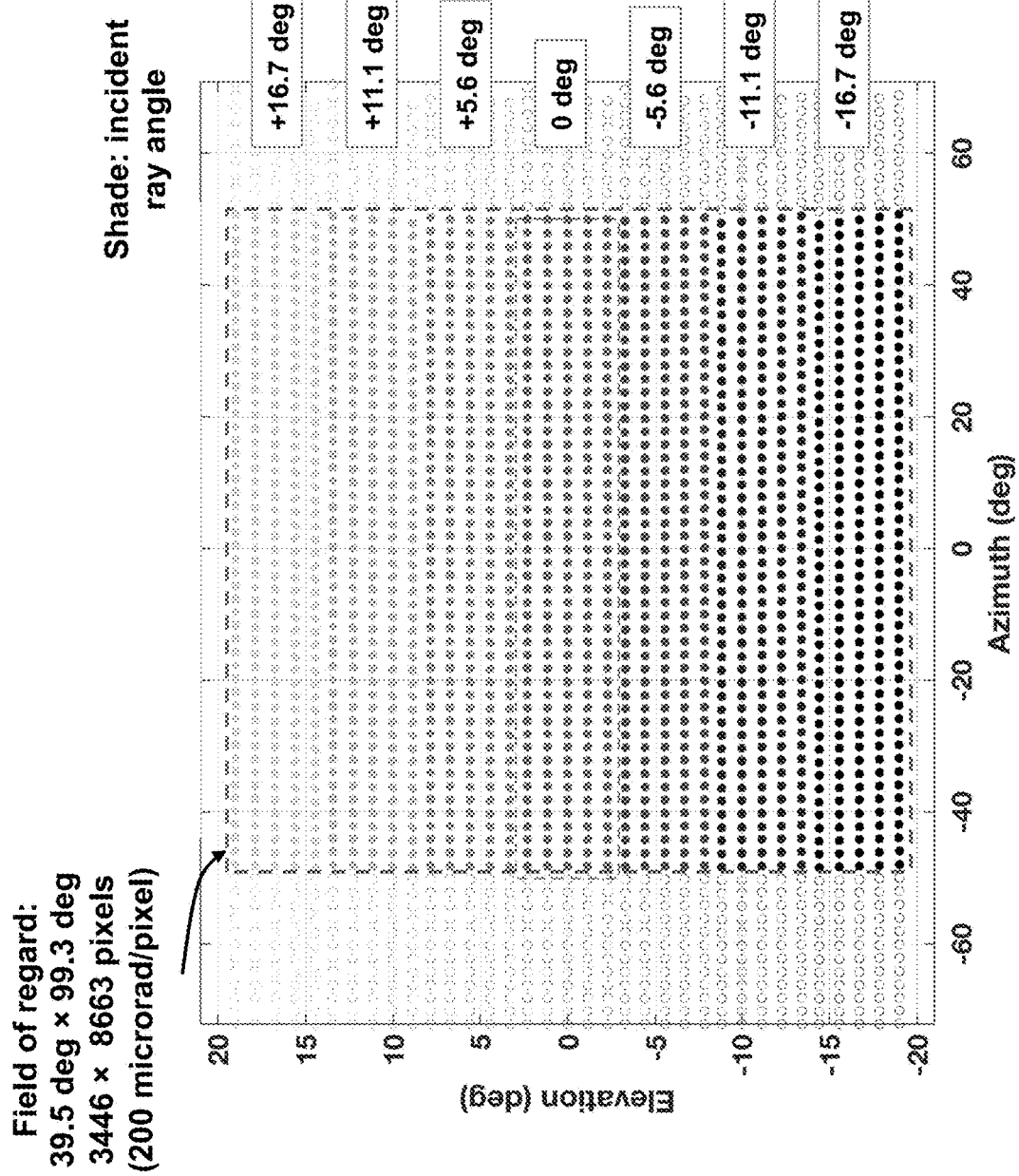
FIG. 11 depicts a large scan field-of-regard of the polygonal scanner of FIG. 3.

Consider the blocked approach. Here the LOS difference between facets is $\beta=N_y\phi(1-\gamma)=1.2$ deg. To stack up enough blocks to cover the desired field-of-regard, the number of different incidence angles is $N_{shifts} \geq \theta_{el}/\beta N_{facets}=4.8$. Compared to the interdigitated design, the mechanism that shifts the incident beam must have a wider range of motion. FIG. 10 shows the far-field scan pattern for the blocked approach, with compensation applied so that the swipes are parallel. FIG. 11 shows a related design using the same polygon as FIG. 10, but with 7 different incidence angles. A large field-of-regard is realized.

The scanner description so far has assumed that only a single ladar is reflected off a given polygon. When wider scanning is needed, multiple ladars can be reflected off a common polygon, thereby conserving system size, weight, power, and cost. Each ladar is arranged to look in a different direction, so that at a given instant they reflect off a different facet of the polygon.

Data Processing:

The function of the data processing element is to convert the raw photo-detection event times and scanner position data into a 3D point cloud representing the location of surfaces that scattered light back to the receiver. The data processing rate must be fast enough to ingest the real-time data stream, and the latency must be low enough so that cues can be reported promptly to operators or other surveillance sensors. A latency on the scale of the update period $U^{-1}$ is a reasonable assumption.

There are several approaches for estimating surface locations and properties from noisy Geiger-mode ladar raw data. In the current invention certain approximations are valid which simplify the processing substantially. The situation is similar to that of patent application PCT/US2015/046682 in which processing is done in an angle-angle-range coordinate space since the translational movement of the sensor during the collection of an image is small compared to the desired spatial resolution.

A significant difference from established processing techniques is that the wide variety of distances to a target surface leads to a significant dynamic range in the strength of the return signals, perhaps on the order of $10^3$-$10^4$. Because the photo-detection physics is substantially non-linear, novel techniques are applied in the surface estimation algorithms. The techniques include a) setting thresholds that are range-dependent; b) assigning an angular resolution that is dependent on signal strength; c) crosstalk mitigation by assigning each detection event a score indicating the probability it arose through crosstalk effects.

The false alarm rate $\Gamma_{FA}$ in the data processing sub-system is defined as the number of times per scan period $U^{-1}$ that a surface is declared when in fact a surface is not present at that location. False alarms occur when the number of photo-detections within a given voxel exceeds the given threshold for declaring a surface. Sophisticated processing algorithms use weighting schemes based on pixel sensitivity and illumination intensity, and perform convolutions over the 3D point spread function of the ladar hardware in order to better localize the surface. A lower bound for the false alarm rate can be easily estimated using Poisson statistics if the signal rate and background rates follow the Poisson distribution. This is the case for the present invention because of the high degree of speckle averaging that occurs within the photo-detectors. The number of speckle realizations per photo-detector is approximately $(\Lambda/\lambda f_{APD})^2$, which for the example design is 45.

The number of photo-detections $N_{det}$ collected during a given measurement of a given voxel is a random number drawn from a Poisson distribution. The surface estimation algorithm attempts to decide whether the underlying distribution is more likely due to background or from a real surface. The background signal can arise due to intrinsic noise events within the detector itself, background light from the scene, or crosstalk from avalanche events in other pixels within the array. Background light can be filtered spectrally and reduced to acceptable levels. The detectors can be operated at reduced temperatures thereby reducing the intrinsic noise. Crosstalk is often the dominant background contribution, and is also highly correlated temporally. In this analysis we assume that 20% of the pixels fire at a uniform rate over a range extent $\Delta=50$ m, and that for each of these events there is a 20% probability that a pixel somewhere in the array fires due to crosstalk. In this simple picture the effective background rate per pixel in the region where most of the pixels are firing is $\gamma_x=0.2 \times 0.2/\Delta=8\times 10^{-4}$ m$^{-1}$. For comparison, a dark count rate of 10 kHz yields a background rate of $\gamma_{DCR}=6.7\times 10^{-5}$ m$^{-1}$. Given a system range resolution s, the number of background events per voxel is $N_b=N_i \gamma_x s$, where, for voxel size $\Phi^2 s$, the number of pixel interrogations conducted per angular resolution element is $N_i=(\Phi R_{max}/b)^2 (N_{det,req}/N_{pe})$ (see section above describing the ladar receiver). For the example design, $N_i=200$ and $N_b=0.16$. If the signal observed in a given voxel is due to background, the number of detected photons will be drawn from a Poisson distribution with mean $N_b$. On the other hand, if there is a real surface present, the observation will drawn from a Poisson distribution with mean $N_{det,req}$. A threshold is chosen so that the probability of declaring a surface present when it is actually present is sufficiently high. For example, use $P_{det}$=90%. The required threshold t is determined by solving for t in the equation $$1-P_{det}=\Sigma_{n=0}^{t} P(n;N_{det,req})$$

where $P(n; m)=m^n e^{-m}/n!$ is the Poisson probability density for observing n events when the mean number of events is m. We obtain t=5.

The false alarm rate per scan is the product of the number of voxels per scan and the probability of a false alarm per voxel: $\Gamma_{FA}=(R_{max}/s)N_T \Sigma_{n=t}^{\infty} P(n,N_b)$ Since the background due to crosstalk is concentrated over an extent $\Delta$, $R_{max}$ can be replaced by $\Delta$ for the example design, given these crude assumptions, $\Gamma_{FA}$=35 per scan in the high crosstalk region. Over the remainder of the range extent, where background is dominated by dark counts, the number of expected background detections is $N_b$=1.3×10$^{-2}$, and $\Gamma_{FA}$=3×10$^{-3}$ per scan. The false alarm rate per scan can be further reduced by increasing the link budget through $N_{det,req}$, decreasing the $P_{det}$ requirement, and reducing the crosstalk in the devices.

Threat Detector and Tracker:

The functions of the threat detector and tracking subsystem include the following:

- Remove slight misalignments between point clouds generated in different scans so that all data is in a common reference frame.
- Provide highly-reliable cues (i.e. low false-alarm rate) to the operator indicating where threat objects are located and how they are moving. False alarm mitigation can be conducted by enforcing the condition that a target must appear in at least two sequential scans in order to not be rejected as arising due to fluctuations of background noise and crosstalk.
- Classify threats, and differentiate threats from non-threat objects, based on factors such as motion (and statistics thereof), acceleration (and statistics thereof), return signal strength (and time-variation thereof, and motion-dependence thereof).
- Establish baseline statistical descriptions of "normal" behavior in the scene so that anomalies can be detected.
- Filter detections through user-supplied criteria such as 3D location, speed, etc.
- Generate pointing cues for other sensors at given locations so they can be automatically aimed at threat objects and collect narrow FOV images.
- Display the threat picture and its time-evolution for human operators.

The above-described embodiments can be implemented in any of numerous ways. For example, the data processing applications 210, 220, 230, 240, 250 may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output.

Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various applications or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "application", "algorithm", "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Several embodiments of the present invention have been described. Nevertheless, it will be understood that various modifications may be made without departing from the spirit and scope of the invention. Accordingly, other embodiments are within the scope of the following claims.

What is claimed is:

1. A system for generating a 3D image of a scene comprising:
   a transmitter comprising a pulsed laser generating optical pulses for illuminating the scene, wherein the optical pulses have a pulse width of less than 20 nanoseconds and a pulse repetition frequency in the range of 20 kHz to 200 kHz;
   a receiver comprising a sensor to detect light scattered and reflected from the scene, wherein the sensor comprises one or more 2D-arrays of Geiger-mode avalanche photodiodes;
   a scanning system that allows the transmitter and receiver subsystem field-of-view (FOV) to interrogate a field-of-regard (FOR) of at least 30 degrees, with update rates faster than once per 5 seconds, resolution higher than 1 million resolution elements per second, and FOR aspect ratios of 1:10 to 1:1;
   wherein the scanning system comprises a polygonal mirror scanner that rotates around a rotational axis and scans the FOV across the scene and wherein the polygonal mirror scanner comprises a number of facets in the range of 3 to 12 and wherein each facet is tilted by a different angle relative to the rotational axis of the polygonal mirror scanner;
   a data processing computer that continuously generates 3D point clouds with latency less than 5 seconds, and generates alarms indicating anomalous activity within the scene; and
   a secondary angular shifting element arranged between the receiver and the polygonal mirror scanner and wherein the secondary shifting element tilts the FOV.

2. The system of claim 1, wherein the secondary angular shifting element is synchronously modulated with the polygonal scanner's rotation.

3. The system of claim 1, wherein the receiver comprises a plurality of additional sensors and wherein each additional sensor comprises one or more 2D-arrays of Geiger-mode avalanche photodiodes and wherein each additional sensor receives light reflected from different facets of the polygonal mirror scanner.

4. The system of claim 1, wherein the receiver comprises a plurality of additional sensors and wherein each additional sensor comprises one or more 2-D arrays of Geiger-mode avalanche photodiodes and wherein each additional sensor is operated so as to be sensitive to light originating from scene elements located at different ranges.

5. The system of claim 1, wherein the data processing computer is coupled to the receiver to receive data from the receiver and wherein the data processing computer comprises two or more of a point cloud formation algorithm, a surface estimation algorithm, a 3D change detection algorithm, a 3D track creation algorithm, and a false alarm reduction algorithm.

6. The system of claim 5, wherein the data processing computer processes the received data via the 3D change detection algorithm to detect geometric changes over time and track objects moving in the scene.

7. The system of claim 5, wherein the data processing computer further processes the received data via the surface estimation algorithm to reduce crosstalk effects between the Geiger-mode avalanche photodiodes by taking into account a probability that each raw photon detection is a product of crosstalk from neighboring pixel firing events.

8. The system of claim 5, wherein the data processing computer processes the received data via the false alarm reduction algorithm to reduce false alarms.

9. The system of claim 8, wherein the false alarm reduction algorithm reduces false alarms by classifying a potential target based on observed behavior.

10. The system of claim 8, wherein the false alarm reduction algorithm reduces false alarms by classifying a potential target based on return signal strength and time variations of the signal strength.

11. The system of claim 8, wherein the false alarm reduction algorithm reduces false alarms by utilizing third party information comprising building locations, digital terrain elevation data, or foliage location and type.

12. The system of claim 8, wherein the 3D track creation algorithm provides detection or track information over a line of communication to a central operator station.

13. The system of claim 1, further comprising position sensors.

14. The system of claim 1, further comprising orientation sensors and wherein the orientation sensors comprise inertial measurement unit, gyros, magnetometers or a compass.

15. The system of claim 1, further comprising an integrated navigation system to determine the location and orientation of the ladar system, and therefore an object's 3D location in geographic coordinates.

16. A system for generating a 3D image of a scene comprising:
    a transmitter comprising a pulsed laser generating optical pulses for illuminating the scene, wherein the optical pulses have a pulse width of less than 20 nanoseconds and a pulse repetition frequency in the range of 20 kHz to 200 kHz;
    a receiver comprising a sensor to detect light scattered and reflected from the scene, wherein the sensor comprises one or more 2D-arrays of Geiger-mode avalanche photodiodes;
    a scanning system that allows the transmitter and receiver subsystem field-of-view (FOV) to interrogate a field-of-regard (FOR) of at least 30 degrees, with update rates faster than once per 5 seconds, resolution higher than 1 million resolution elements per second, and FOR aspect ratios of 1:10 to 1:1;
    wherein the scanning system comprises a polygonal mirror scanner that rotates around a rotational axis and scans the FOV across the scene and wherein the polygonal mirror scanner comprises a number of facets in the range of 3 to 12 and wherein each facet is tilted by a different angle relative to the rotational axis of the polygonal mirror scanner;

a data processing computer that continuously generates 3D point clouds with latency less than 5 seconds, and generates alarms indicating anomalous activity within the scene; and one or more unequal beam splitters arranged in an optical path between the scanned FOV and additional sensors and wherein the beam splitters split the light from the scanned FOV so that each of the additional sensors is illuminated by a different fraction of the received light.

17. A method for generating a 3D image of a scene comprising:

providing a transmitter comprising a pulsed laser generating optical pulses and illuminating the scene, wherein the optical pulses have a pulse width of less than 20 nanoseconds and a pulse repetition frequency in the range of 20 kHz to 200 kHz;

detecting light scattered and reflected from the scene via a receiver comprising a sensor, wherein the sensor comprises one or more arrays of Geiger-mode avalanche photodiodes;

scanning a field-of-view (FOV) of the transmitter and receiver subsystem with a scanning system over a field-of-regard (FOR) of at least 30 degrees to generate data, with update rates faster than once per 5 seconds, resolution higher than 1 million resolution elements per second, and FOV aspect ratios of 1:10 to 1:1, wherein the scanning system comprises a polygonal mirror scanner that rotates around a rotational axis and scans the FOV across the scene and wherein the polygonal mirror scanner comprises a number of facets in the range of 3 to 12 and wherein each facet is tilted by a different angle relative to the rotational axis of the polygonal mirror scanner;

processing the data using a data processing computer that continuously generates 3D point clouds with latency less than 5 seconds, and generates alarms indicating anomalous activity within the scene; and wherein the scanning system further comprises a secondary angular shifting element arranged between the receiver and the polygonal mirror scanner and wherein the secondary shifting element tilts the FOV.

18. A method for generating a 3D image of a scene comprising:

providing a transmitter comprising a pulsed laser generating optical pulses and illuminating the scene, wherein the optical pulses have a pulse width of less than 20 nanoseconds and a pulse repetition frequency in the range of 20 kHz to 200 kHz;

detecting light scattered and reflected from the scene via a receiver comprising a sensor, wherein the sensor comprises one or more arrays of Geiger-mode avalanche photodiodes;

scanning a field-of-view (FOV) of the transmitter and receiver subsystem with a scanning system over a field-of-regard (FOR) of at least 30 degrees to generate data, with update rates faster than once per 5 seconds, resolution higher than 1 million resolution elements per second, and FOV aspect ratios of 1:10 to 1:1, wherein the scanning system comprises a polygonal mirror scanner that rotates around a rotational axis and scans the FOV across the scene and wherein the polygonal mirror scanner comprises a number of facets in the range of 3 to 12 and wherein each facet is tilted by a different angle relative to the rotational axis of the polygonal mirror scanner;

arranging one or more unequal beam splitters in an optical path between the scanned FOV and additional sensors and wherein the beam splitters split the light from the scanned FOV so that each of the additional sensors is illuminated by a different fraction of the received light; and processing the data using a data processing computer that continuously generates 3D point clouds with latency less than 5 seconds, and generates alarms indicating anomalous activity within the scene.

\* \* \* \* \*